(12) United States Patent
Syed et al.

(10) Patent No.: US 11,361,821 B2
(45) Date of Patent: Jun. 14, 2022

(54) DRIFT AND NOISE CORRECTED MEMRISTIVE DEVICE

(71) Applicant: International Business Machines Corporation, Armonk, NY (US)

(72) Inventors: Ghazi Sarwat Syed, Zurich (CH); Benedikt Kersting, Zurich (CH); Abu Sebastian, Adliswil (CH)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 17/094,744

(22) Filed: Nov. 10, 2020

(65) Prior Publication Data

US 2022/0148655 A1 May 12, 2022

(51) Int. Cl.
*G11C 13/00* (2006.01)

(52) U.S. Cl.
CPC ...... *G11C 13/0033* (2013.01); *G11C 13/0004* (2013.01); *G11C 13/0011* (2013.01); *G11C 2213/53* (2013.01)

(58) Field of Classification Search
CPC ............ G11C 13/0033; G11C 13/0004; G11C 13/0011; G11C 2213/53
See application file for complete search history.

(56) References Cited

U.S. PATENT DOCUMENTS

| | | | |
|---|---|---|---|
| 8,923,039 B2* | 12/2014 | Annunziata | G11C 11/161 365/158 |
| 9,548,741 B1 | 1/2017 | Kvatinsky | |
| 9,691,479 B1 | 6/2017 | Merced Grafals | |
| 9,847,129 B2 | 12/2017 | Buchanan | |
| 10,497,866 B1 | 12/2019 | Fuller et al. | |
| 10,553,793 B2 | 2/2020 | Jha et al. | |
| 2014/0211540 A1* | 7/2014 | Papandreou | G11C 29/021 365/148 |
| 2015/0256178 A1 | 9/2015 | Kvatinsky | |
| 2016/0189774 A1* | 6/2016 | Xie | G11C 13/0033 365/163 |
| 2017/0125096 A1* | 5/2017 | Papandreou | G11C 11/5642 |

(Continued)

FOREIGN PATENT DOCUMENTS

| | | |
|---|---|---|
| CN | 107945829 A | 4/2018 |
| CN | 110168761 A | 8/2019 |
| CN | 111275177 A | 6/2020 |

OTHER PUBLICATIONS

Zhang et al., "Truly concomitant and independently expressed short- and longterm plasticity in Bi2O2Se-based three-terminal memristor", Wiley Online Library, 10.1002/adma.201805769, 39 pages, Nov. 20, 2018.

(Continued)

*Primary Examiner* — Khamdan N. Alrobaie
(74) *Attorney, Agent, or Firm* — Mark Bergner

(57) ABSTRACT

A memristor memory device comprises a memristive memory cell, an input terminal, an output terminal, and a gate terminal. The input terminal and the output terminal are directly attached to the memristive memory cell, and the gate terminal is electrically isolated from the memristive memory cell. The gate terminal is configured for receiving an electrical signal for a volatile modulation of a conductance of the memristive memory cell, by which a correction of non-ideal conductance modulations of the memristor memory device is achieved.

20 Claims, 7 Drawing Sheets

(56) References Cited

U.S. PATENT DOCUMENTS

| | | | |
|---|---|---|---|
| 2017/0221558 A1 | 8/2017 | Hu | |
| 2019/0065929 A1 | 2/2019 | Koelmans et al. | |
| 2019/0214557 A1 | 7/2019 | Bahar | |
| 2019/0303751 A1 | 10/2019 | Werner et al. | |
| 2020/0161373 A1* | 5/2020 | Cheng | G11C 13/0026 |
| 2020/0227635 A1* | 7/2020 | Yang | H01L 45/1226 |
| 2021/0098611 A1 | 4/2021 | Hersam | |

OTHER PUBLICATIONS

List of IBM Patents or Patent Applications Treated as Related, Nov. 10, 2020, 2 pgs.

Mohammad B. et al., "Hybrid Memristor-CMOS Memory Cell: Modeling and Design", Published Date:Dec. 22, 2011.

Koelmans, W.W., "Projected phase-change memory devices", Article in Nature Communications, 8 pages, Sep. 2015.

Ding, K. et al., "Phase-change heterostructure enables ultralow noise and drift for memory operation", Phase-Change Memory, Science 366, 210-215 (2019), 7 pages, DOI: 10.1126/science.aay0291, Downloaded from: http://science.sciencemag.org/.

Berdan, R., Vasilaki, E., Khiat, A et al. Emulating short-term synaptic dynamics with memristive devices. Sci Rep 6, 18639 (2016). https://doi.org/10.1038/srep18639.

Ohno, T., Hasegawa, T., Tsuruoka, T et al. Short-term plasticity and long-term potentiation mimicked in single inorganic synapses. Nature Mater 10, 591-595 (2011). https://doi.org/10.1038/nmat3054.

International Search Report and Written Opinion dated Jan. 27, 2022 from corresponding PCT Application No. PCT/IB2021/060194 filed Nov. 4, 2021.

\* cited by examiner

700

702 providing a memristor memory device 704 providing an electrical signal for a volatile modulation of a conductance of the memristive memory cell 706 correcting non-ideal conductance modulations to the memristor memory device

FIG. 7

US 11,361,821 B2

DRIFT AND NOISE CORRECTED MEMRISTIVE DEVICE

BACKGROUND

Disclosed herein is a memristor memory device comprising a memristive memory cell. More specifically, the disclosure is directed to a method for operating a memristor memory device comprising a memristive memory cell.

Multilevel-cell (MLC) storage is a typical way for achieving increased capacity and thus lower cost-per-bit in memory technologies. For this, phase-change memory (PCM) is a new solid-state memory technology that exploits the thermally-induced resistivity change of, e.g., chalcogenide components for non-volatile data storage. PCM possesses certain features, such as high cycling endurance, low reads/write latency and excellent scalability that make it an interesting candidate not only for extending and eventually replacing the incumbent Flash memory, but also for enabling disruptive change in future computing systems. The latter stems from the potentially ability of PCM to react as both, storage (non-volatile, cheap, high capacity), as well as memory (fast, durable) because of its universal characteristics.

SUMMARY

According to one aspect disclosed herein, a memristor memory device comprising a memristive memory cell may be provided. The memristive memory device may comprise an input terminal, an output terminal, and a gate terminal. The input terminal and the output terminal may be directly attached to the memristive memory cell, and the gate terminal may be electrically isolated from the memristive memory cell. The gate terminal may be configured for receiving an electrical signal for a volatile modulation of a conductance of the memristive memory cell. Thereby, non-ideal conductance modulations of the memristor memory device may be corrected.

According to another aspect disclosed herein, a method for operating a memristor memory device comprising a memristive memory cell may be provided. The memristor memory device may comprise an input terminal, an output terminal, and a gate terminal, wherein the input terminal and the output terminal may be directly attached to the memristive memory cell. The gate terminal may be electrically isolated from the memristive memory cell. The method may further comprise providing an electrical signal for a volatile modulation of a conductance of the memristive memory cell. Thereby, non-ideal conductance modulations of the memristor memory device may be corrected.

BRIEF DESCRIPTION OF THE SEVERAL VIEWS OF THE DRAWINGS

Embodiments of the invention are described with reference to different subject-matters. In particular, some embodiments are described with reference to method type claims, whereas other embodiments are described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within this document.

The aspects defined above, and further aspects of the various embodiments, are apparent from the examples of embodiments to be described hereinafter and are explained with reference to the examples of embodiments, but to which the invention is not limited. Various embodiments may be described as having certain advantages—however, some embodiments may not have these potential advantages and these potential advantages are not necessarily required of all embodiments.

Figure 1:
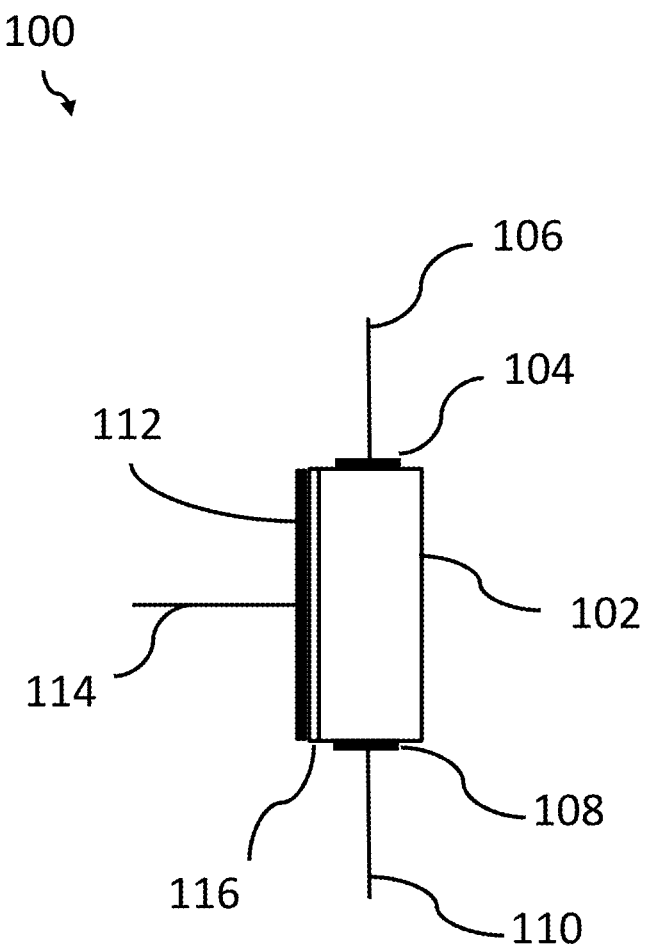

Embodiments will be described, by way of example only, and with reference to the following drawings:

FIG. 1 is a block diagram of an embodiment of the inventive memristor memory device comprising a memristive memory cell, according to some embodiments.

Figure 2:
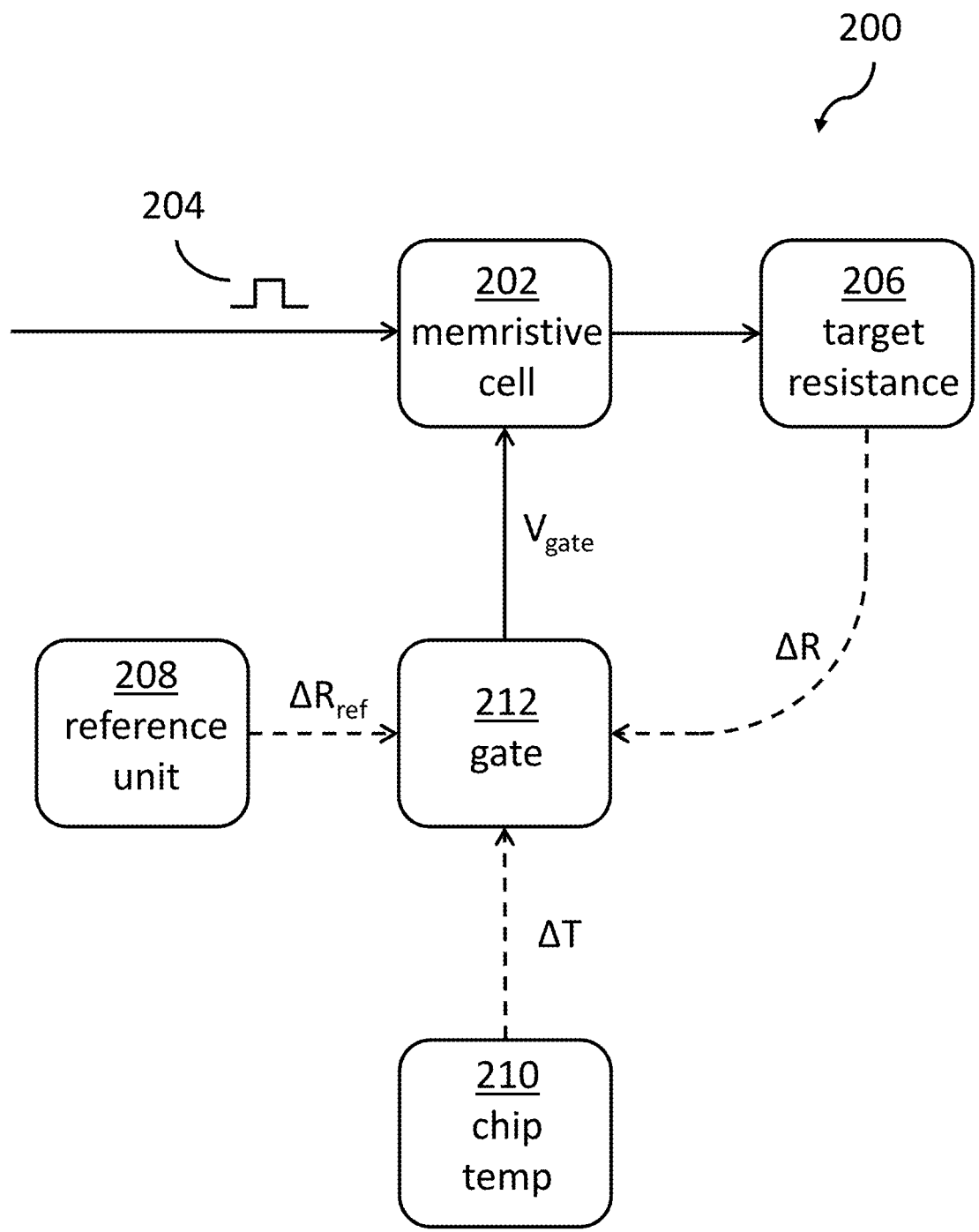

FIG. 2 is a block diagram of the functional principle of the proposed system and method, according to some embodiments.

Figure 3:
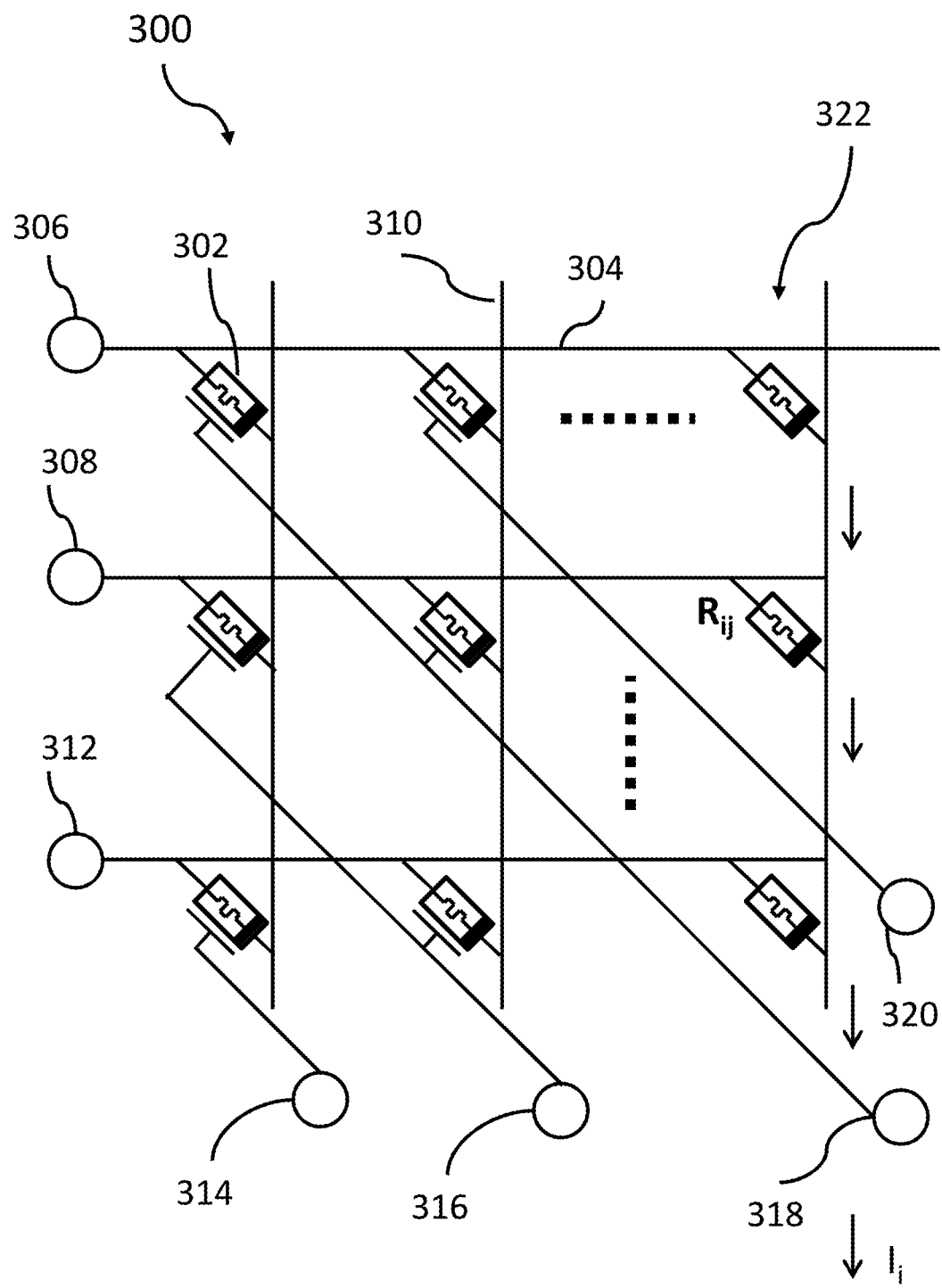

FIG. 3 is a block diagram of an embodiment of a crossbar array with memristor memory devices, according to some embodiments.

Figure 4:
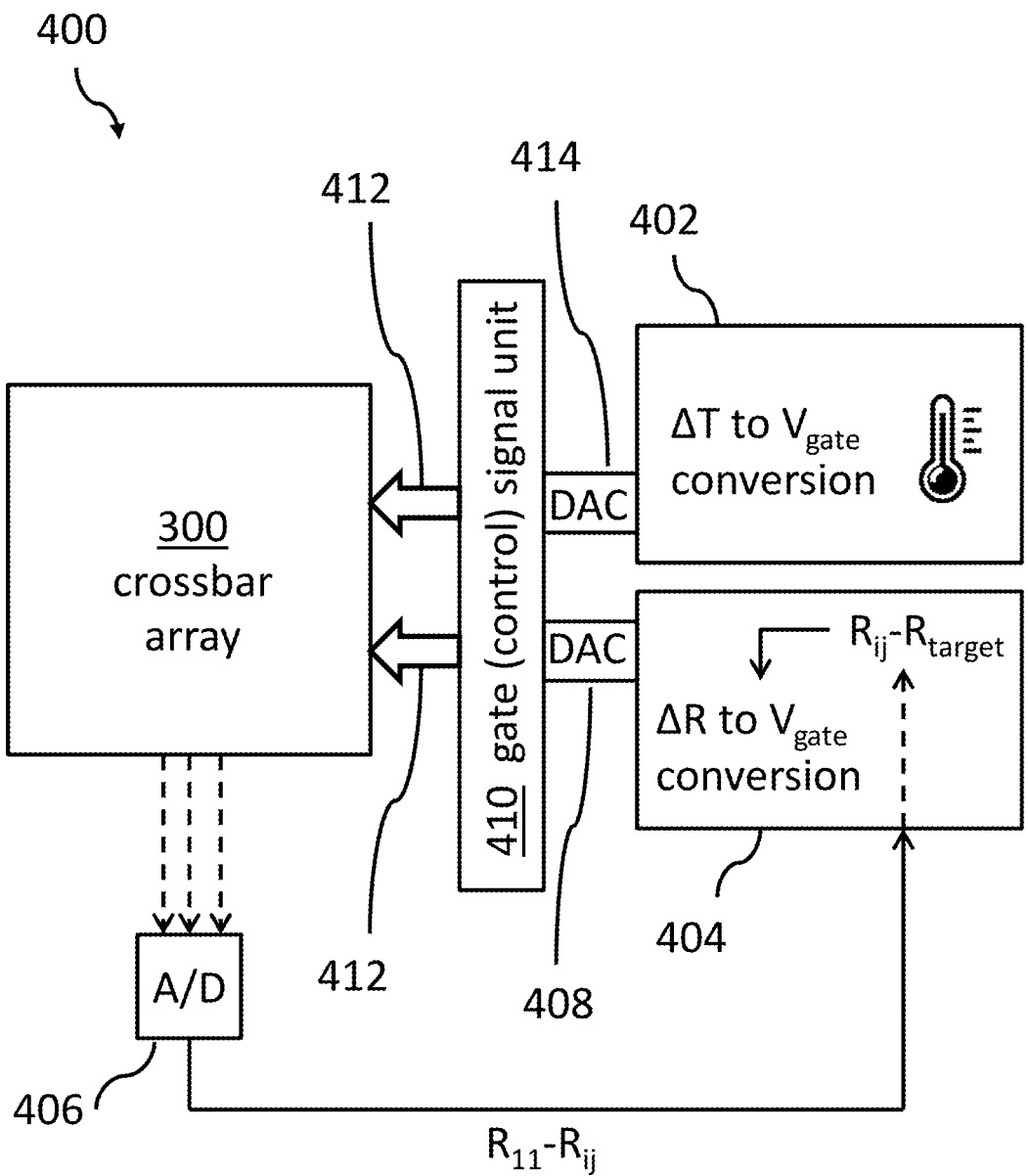

FIG. 4 is a block diagram of an embodiment of the crossbar array with temperature noise and resistance drift compensation units, according to some embodiments.

Figure 5:
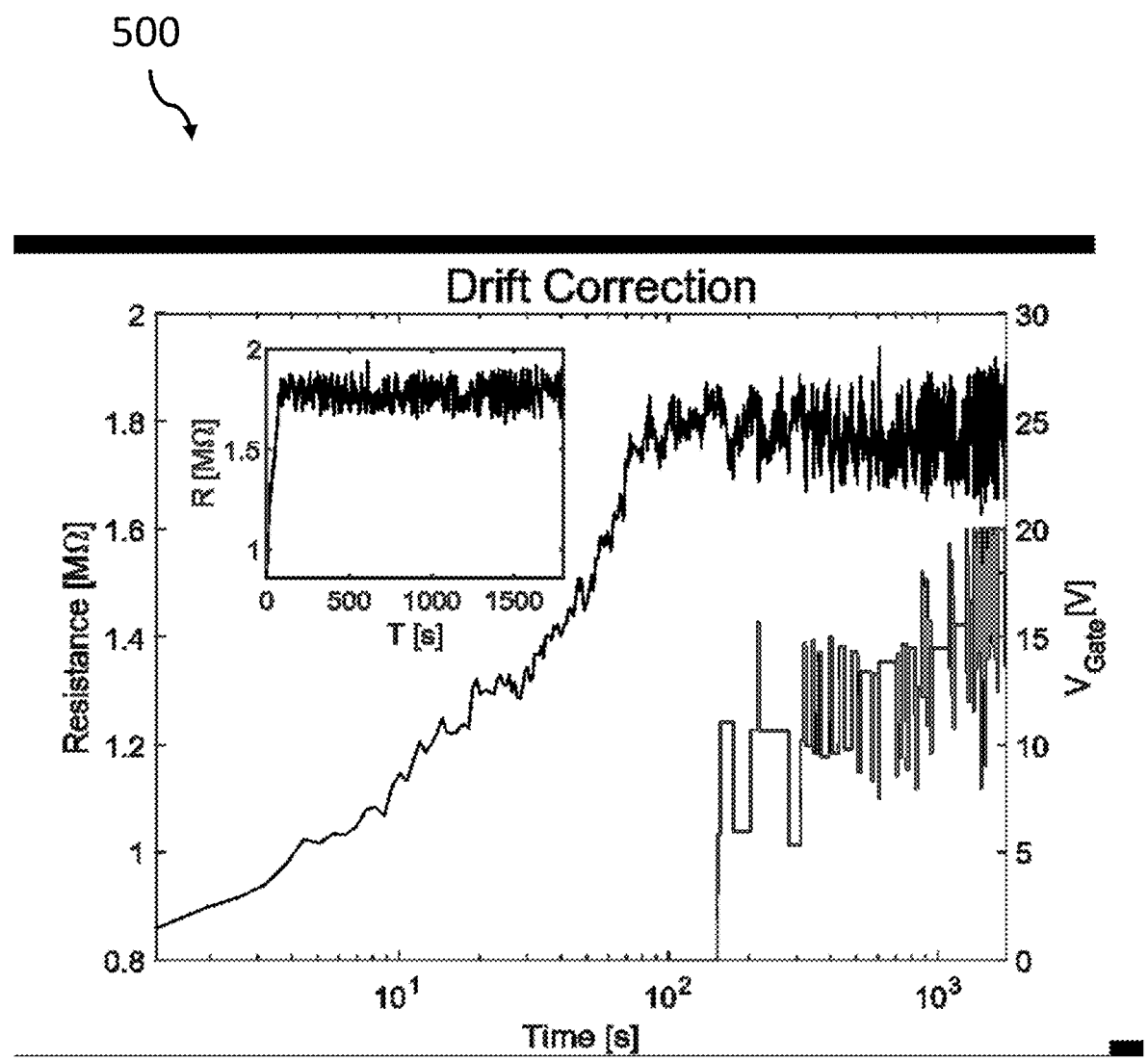

FIG. 5 is a diagram of first experimental evidence of the proposed system and method, according to some embodiments.

Figure 6:
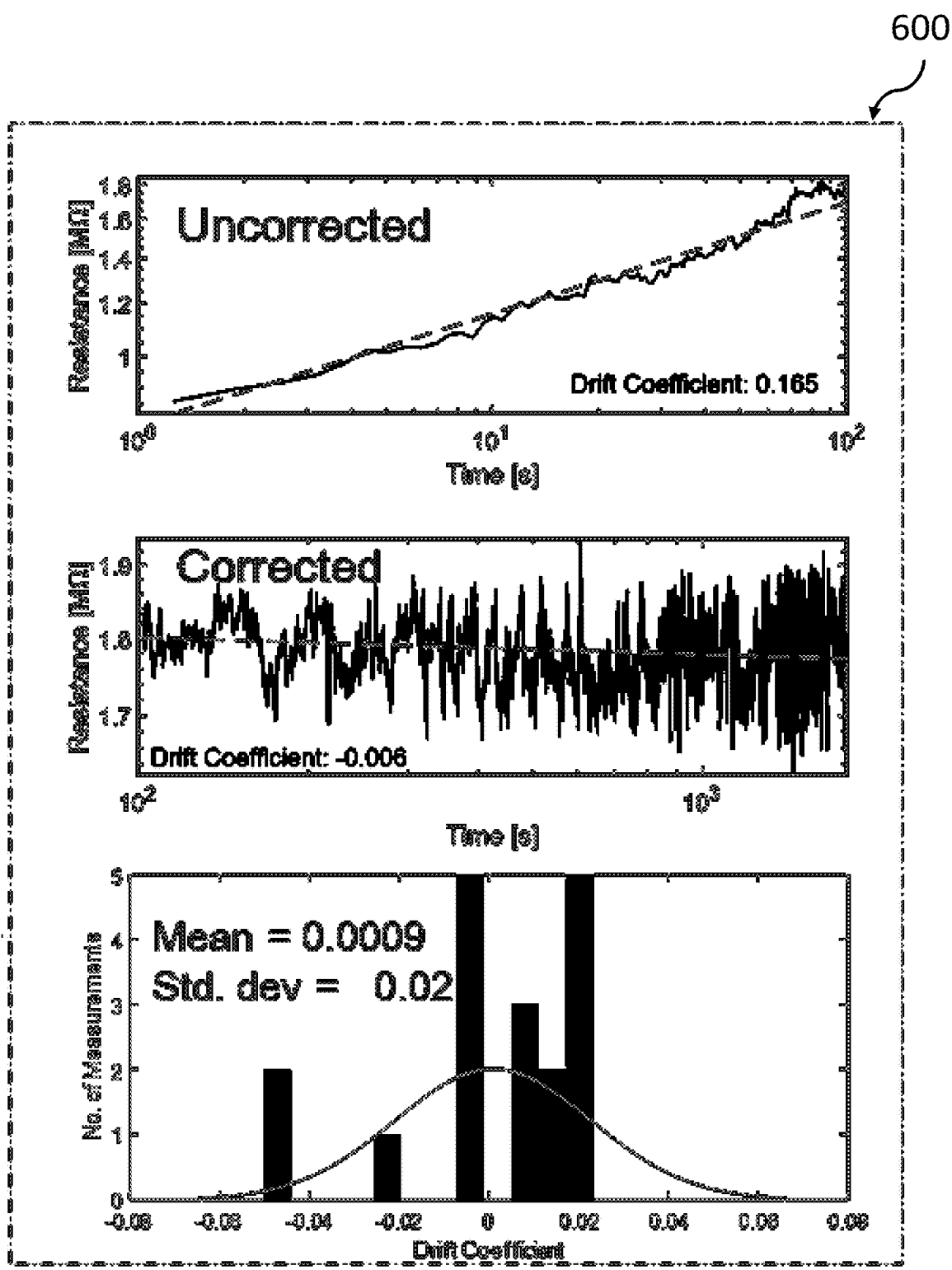

FIG. 6 is a diagram of second experimental evidence of the proposed system and method, according to some embodiments.

FIG. 7 is a flowchart of an embodiment of the method for operating a memristor memory device comprising a memristive memory cell, according to some embodiments.

DETAILED DESCRIPTION

In order for PCM to become a viable technology for higher-volume manufacturing, a number of issues may need to be addressed. First and foremost, the reliability of the technology should be brought to levels similar to those of existing technologies. Experimental results and simulations suggest that thermal disturbance and resistance drift are the most important potential reliability concerns for PCM memory technologies. Thermal disturbance refers to the problem of inadequately altering the state of the cell by programming another cell and its vicinity (thermal process-talk). On the other side, resistance drift is a phenomenon according to which the resistivity of the amorphous phase of, e g, many chalcogenide materials increases over time. Drift has been attributed to structural relaxation and stress release in the amorphous matrix, and is particularly detrimental in multilevel-cell storage because random fluctuations of the programmed resistance of closely-spaced levels may cause them to overlap and thus lead to decoding errors. This task may be addressed by the here proposed technical solution.

In the context of this description, the following conventions, terms and/or expressions may be used:

The term "memristor memory device" (memristor=a portmanteau of memory resistor) may be a memory device based on a memristive cell, namely, the memristor. It may denote a non-linear normally two-terminal electrical component—but here implemented as a three terminal device—relating electric charge and magnetic flux linkage. For devices, typically, phase change materials (PCMT) may be used. Such PCMT can change its resistivity between a plurality of different levels by transitioning from an amorphous to a crystalline phase. This change may be heat induced. This way, multilevel-cell (MLC) storage devices, comprising a plurality of memristive memory cells, may be created.

The term "memristive memory cell" may denote a memristor core unit or memristive memory cell of a memory device. The memristive memory cell may comprise the phase change material and may store the data up by changing its resistivity. Typically, in readout, the selected bit-line of a crossbar array, comprising a plurality of memristive memory cells at the crossing points, is biased to a constant voltage (typically a couple of 100 mV) by a voltage regulator. The sensed current $i_{read}$ may be integrated by a capacitor and the resulting voltage is then digitized by an on ship cyclic analog-two-digital converter. Additionally, the readout characteristic may be calibrated via the use of an on-chip reference poly-silicon resistor. For programming, the voltage generated off-chip may be converted on-chip into a programming current $i_{prog}$. This count may then be mirrored onto a selected bit line for the desired duration of the programming pulse which may change the mixture of the crystalline and the amorphous phase of the PCM.

The term "gate terminal" may denote an (third) electrode adjacent but electrically isolated from the PCM of the memristive memory cell. Charges at the gate terminal and the gate itself may influence the behavior of the PCM, i.e., each single memristive memory cell and thus also within the memristor memory device depending on the wiring of the gates of the plurality of the single memristive memory cells.

The term "volatile modulation"—in particular those induced by the gate—may denote forced changes in the resistivity of a memristive memory cell device due to an applied gate voltage.

The term "non-ideal conductance modulations" may denote effects in PCM-based devices, such as a memristor memory device, comprising a plurality of memristive memory cells using the PCM by the temperature-based and resistance drift effects.

The term "resistance drift" may denote the phenomenon according to which the resistivity of the amorphous phase of phase-change materials—e.g., chalcogenide—increases over time. Drift may be caused by structural relaxation and stress release in the amorphous matrix of the PCM, and is particularly detrimental in multilevel-cell storage devices because of random fluctuations of the program to resistance of closely-spaced resistance levels. Despite the use of adaptive level thresholds, the bit-error rate in MLC PCM deteriorates over time because the noise margin between adjacent levels tends to increase. This is because drift is a random process and thus the increase of the resistance of each cell invoice in a stochastic manner. Moreover, the rate of increase, i.e., the drift exponent is itself a random variable. While it is true that the average drift exponent increases with a cell resistance, significant variability is typically observed around the mean values. As a result of this, a small number of cells from each resistance distribution exhibit a distinctly different drift exponent from the rest. The drift versus time trajectories of two such cells programmed in, e.g., the adjacent levels "2" and "3", may eventually shift closer together and finally cross each other at later time instances, and due to shift exponents deviating from the mean behavior, although the cell-levels after programming have been apart significantly.

The term "thermal disturbance drift of the resistance" may denote the undesired effect of thermal changes of memristive memory cells of inadvertently altering the state of a cell by programming another cell in its vicinity; it is relevant for PCM because the latter relies on family and used state changes, which may cause thermal interference between adjacent cells at small device dimensions. The disturbances to the resistance states may also result from the variations in the chip temperature from thermal changes in the environment.

The term "filamentary memristor" may relate to the memristive switching effects in insulating or semi-conducting solid state electrolytes that occur through formation of conductive channels (filaments).

The term "crossbar array" may denote a structure of electrically conducting lines crossing each other. Horizontal lines may define word-lines while vertically oriented lines may be denoted as bit-lines. Each crossing point of the word-line and a bit-line may comprise an electrical or electronic device connected with one end to the word line and to the respective bit line. In this concept, each crossing comprises a memristive memory cell, such that the crossbar array comprising a plurality of memristive memory cells may build a core component of the memristor memory device.

The term "temperature effect control unit" may denote an electronic unit adapted for counter-acting the thermal disturbance effect described above.

The term "resistance drift correction unit" may denote in electronic unit adapted for counter-acting the above described resistive drift effect present in PCM.

The proposed memristor memory device comprising a memristive memory cell may offer multiple advantages, contributions, and technical effects.

Basically, it may lay the foundation to overcome the current challenges of PCM-based memristive memory devices to become a viable technology—potentially replacing flash memory—for higher volume manufacturing memory, as well as, potentially computing devices. It may increase the reliability of the PCM-based memory technology by overcoming negative effects, i.e., volatile conductance modulations, caused by thermal disturbance and resistance drift effects. In particular, the stochastically appearing resistance drift effects have a significantly negative effect on the currently available PCM-based memristive memory devices which may be overcome with the proposed concept.

In particular, a gate terminal may be used to counteract resistance drift effects. The required additional electronic components in the form of a temperature compensation unit and resistance drift compensation unit are marginal if compared to the resulting technical effects, as shown by the experimental evidence. The compensation units may be used for a plurality of memristor memory devices or even larger memristor of memory units comprising a plurality of memristor memory devices. In particular, the random process-based resistance drift effect may be used by the dynamically adapted gate signal generated by the resistance drift compensation unit.

In the following, additional embodiments of the memristive memory device—also applicable to the related method—are described.

According to an embodiment of the memristor memory device, the non-ideal conductance modulations may comprise at least a temporal resistance drift and/or a temperature-induced disturbance of the resistance. These may be the main effects having a negative influence on the reliability of memristor memory devices. However, it is possible that other non-ideal conductance modulations may be addressed and potentially healed by the use of a gate structure adjacent to the PCM of the memristive memory cell.

According to one embodiment of the memristor memory, the memristive memory cell may comprise a phase change material or a filamentary electrolyte. These may be typical examples of PCM. However, as long as negative temperature effects and/or resistance drift affect the PCM and the related device, other types of base material for the memristive memory cell may be used in order to apply the here proposed inventive concept.

According to a useful embodiment of the memristor memory device, the memristor memory device may comprise a plurality of the memristive memory cells—in particular two or more—where the gate terminal is common to the plurality of the memristive memory cells. In an industry scale memristor memory device, potentially millions of memristive memory cells may be combined to form the memristor memory device. At least a portion of the memristive memory cells may have electrically connected gates. They may enable an influence onto the memristor memory cells connected to a common gate line. Hence, groups of memristor memory cells of the memristor memory device may be influenced by gate charges to counteract the negative temperature effect and resistance drift.

According to an advantageous embodiment of the memristor memory device, the plurality of memristive memory devices may be arranged in a crossbar array building a memristor memory unit. The memristor memory unit may be a core component of the memristor memory device. This way, the memristive memory cells become addressable by word-lines and bit-lines if one of the memristive memory cells may be positioned at each crossing point of the word-lines and bit-lines.

According to another advantageous embodiment, the memristor memory device may further comprise a temperature effect control unit whose output may be adapted to provide a temperature-effect control signal corresponding to a temperature difference $\Delta T$ between an ideal working temperature of the memristor memory device and a non-ideal dynamically changing temperature of the memristor memory device. This may advantageously reflect the temperature development of the memristor memory device over time, in particular the actual temperature during a read operation and the historic temperature development since a write—i.e., programming—operation. By having access to the temperature development over time, the temperature effect control unit can compensate the related effects by anticipating the effects related to the temperature development over time.

According to an additionally advantageous embodiment of the memristor memory device, the temperature-effect control unit may further comprise a temperature sensor electrically connected to the temperature-effect control unit, and a pre-calibrated $\Delta T$ to $V_{T, gate}$ conversion unit providing, as the temperature-effect control signal, a voltage of value $V_{T, gate}$ to a group of gate terminals of selected ones of the plurality of the memristor memory devices. The group may range from a single memristive memory cell to the entirety of the memristive memory cells. Advantageously, those memristive memory cells may be grouped together showing a closely related temperature dependency. The temperature sensor may produce a signal depending on the real temperature of one or more memristor memory devices.

According to a further enhanced embodiment of the memristor memory device, the pre-calibrated $\Delta T$ to $V_{T, gate}$ conversion unit may further comprise a first digital-to-analogue converter, adapted for converting a digital temperature-effect control signal to the analogue value $V_{T, gate}$ signal, connected to the gate terminals of the plurality of the memristor memory devices building a memristor memory unit. Hence, volatile modulations due to a temperature effect of the resistance of groups of memristive memory cells (i.e., devices) may be corrected and/or compensated.

According to another advantageous embodiment, the memristor memory device may further comprise a resistance drift correction unit which output is adapted to provide a resistance-drift control signal corresponding to a resistance difference $\Delta R$ between a target resistance of the memristor memory device and a read resistance of the memristor memory device. The read resistance may be measured directly after the programming/writing operation. This may define a reference value for the resistivity of the respective memristive memory cell. Based on this this value, a correction or compensation signal for the gate may be generated.

According to a further enhanced embodiment of the memristor memory device, the resistance drift correction unit may further comprise a $\Delta R$ to $V_{R, gate}$ conversion unit, providing, as the resistance drift correction control signal, a voltage of value $V_{R, gate}$ to a group of gate terminals of selected ones of the plurality of the memristor memory devices. Similar to the temperature compensation case, the group may range from a single memristive memory cell to the entirety of the memristive memory cells. Advantageously, those memristive memory cells may be grouped together showing a closely related temperature dependency.

According to another further enhanced embodiment of the memristor memory device, the $\Delta R$ to $V_{R, gate}$ conversion unit may further comprise a second digital-to-analogue converter, adapted for converting a digital resistance-effect control signal to the analogue value $V_{R, gate}$ signal, connected to the gate terminals of the plurality of the memristor memory devices, building a memristor memory unit. Hence, volatile modulations due to a resistance drift effect of the resistance of groups of memristive memory cells may be corrected and/or compensated.

According to a further embodiment, the memristor memory unit may comprise a plurality of memristor memory devices arranged in a crossbar array, wherein each of the memristor memory devices comprises a memristive memory cell, wherein the memristor memory device comprising an input terminal, an output terminal, and a gate terminal—in particular, adjacent to the memristive memory cell—and wherein the input terminal and the output terminal may be directly attached to the memristive memory cell. Thereby, the gate terminal may be electrically isolated from the memristive memory cell, and the gate terminal may be configured for receiving electrical signals for a volatile modulation of a conductance of the memristive memory cell. The non-ideal conductance modulations of the memristor memory device may thereby be compensated. The memristor memory unit may further comprise a temperature effect control unit adapted for generating a portion of the received electrical signals based on temperature-based resistance drift effect of each of the memristor memory devices, and a resistance drift correction unit adapted for generating another portion of the received electrical signals based on a time-dependent resistance drift effect of each of the memristor memory devices. Hence, in the memristor memory device comprising a plurality of memristor memory units, each of the memristor memory units may comprise a separate correction/compensation unit so that different areas within the memristor memory device may be treated differently based on, e.g., local differences between the memristor memory units.

In the following, a detailed description of the figures will be given. All instructions in the figures are schematic.

Firstly, a block diagram of an embodiment of the inventive memristor memory device comprising a memristive memory cell is given. Afterwards, further embodiments, as well as embodiments of the method for operating a memristor memory device comprising a memristive memory cell, will be described.

FIG. 1 is a block diagram of an embodiment of the memristor memory device 100 comprising a memristive memory cell 102. The memristor memory device (MME) may be based on, e.g., PCM or filamentary electrolytes. The memristor memory device 100 comprises at least a memristive memory cell 102, as well as, an input terminal (drain via the electrical connection line 106) 104, an output terminal (source via the electrical connection line 110) 108, and a gate terminal 112.

The input terminal 104 and the output terminal 108 are directly attached to the memristive memory cell 102, where the gate terminal 112 is electrically isolated from the memristive memory cell 102 by, e.g., a dielectric (non-conductive) layer 116. The gate terminal 112 is configured for receiving—via line 114—an electrical signal for a volatile modulation of a conductance of the memristive memory cell which causes a correction or compensation non-ideal conductance modulations of the memristor memory device 102.

FIG. 2 is a block diagram of the functional principle 200 of the proposed system and method. The memristive memory cell 202—as the core of the memristor memory device—may be programmed by a signal 204. After the programming the memristive memory cell to a certain resistance level, the target resistance 206 is known (either by reading out directly after the programming or, e.g., from a lookup table). In order to correct the resistance drift effects during read operations, the gate 212 of the memristive memory cell 202 may be utilized for volatile modulations of the device conductance. Thereby, the output of the gate $V_{gate}$ scales proportionally with the difference $\Delta R$ in the measured resistance and the target resistance. A proportionally constant may be defined to correct drift with varying precisions. The reference unit 208 may deliver the required signal corresponding to the value $\Delta R_{ref}$.

Furthermore, the gate 212 may also be used to correct temperature noise effects (temperature-induced drift) during the reading process on the resistance of the memristive cell 202. For this, the gate 212 is utilized for volatile modulations of the device conductance (comparable to the resistance drift). The output of the gate $V_{gate}$ scales proportionally with the difference $\Delta T$ of the chip's temperature under ideal conditions and the chip's temperature 210 (measured by a sensor) under non-ideal dynamically changing conditions (e.g., influenced by "programming heat" or other environment temperature changes). A proportionally constant may be defined to correct drift with varying precisions.

Hence, the memristive memory cell unit may be corrected for both resistance drift and thermal disturbance during the read operation. Furthermore, any non-ideal conductance modulations may be corrected and/or compensated through the gate signal action, independent of the conductance state of the PCM of the memristive of memory cell 202.

FIG. 3 is a block diagram of an embodiment of a crossbar 300 array with memristor memory devices 302. The crossbar array 300 comprises horizontal word lines 304 (only one of which has a reference numeral) and vertical bit lines 310 (only one of which has a reference numeral) for addressing the plurality of the memristor memory devices 302 at the respective crossing points. The word lines 304 and the bit lines 310 are used for addressing the respective memristor memory devices 302. The word lines 304 may be activated by the terminals 306, 308, 312. Terminals for the bit lines 310 are not explicitly shown. The crossbar array 300 represents an i×j matrix with rows of memristor memory devices 302.

Additionally, gate contacts (no reference numeral) are shown for each memristor memory device 302. These gate contacts are connected diagonally if compared to the word lines 304 and the bit lines 310. The diagonal gate lines (no explicit reference numeral) connect a plurality of the memristor memory devices 302 across diagonally positioned crossing points of the word lines 304 and the bit lines 310. Gate voltages may be applied to the gate terminals 314, . . . , 320. The respective gate voltage will only become effective for the addressed memristor memory device 302. During a read-out, the currents of a bit line 310 (e.g., using a bias voltage of a couple of 100 mV) may be integrated and converted by an analog-two-digital converter. The column 322 on the far right of memristive elements $R_{ij}$ may be implemented as a reference resistors.

FIG. 4 is a block diagram 400 of an embodiment of the crossbar array 300 with temperature noise and resistance drift compensation units 402, 404. The output signals of the crossbar array 300—including the output signal of the column 322 (cf. FIG. 3) of reference resistors—are converted by the analog-to-digital converter 406 into a differential signal $R_{11}-R_{ij}$ which is fed back to the resistance drift compensation unit 404. Here, a pre-calibrated $\Delta R$ to $V_{R,gate}$ signal is being generated, converted by the digital-to-analog converter 408 which is connected to the gate (control) signal unit 410 to address—via the symbolic connection 412—the respective gate lines in the crossbar array 300 to correct the effects of the resistance drift during a read operation.

Additionally, the temperature correction unit 402 comprises a temperature sensor and converts the measured temperature of the crossbar array 300 to a signal corresponding to a temperature difference between the measured temperature of the crossbar 300 array and an ideal temperature of the memristive memory cells or the crossbar array 300, thereby compensating thermal disturbance effects negatively influencing the expected resistance level of one or more memristive memory cells of the crossbar array 300. Also here, a pre-calibrated $\Delta T$ to $V_{T,gate}$ conversion is performed, converted by it this digital-to-analog converter 414 and leads to the gate (control) signal unit 410 in order to address respective gate lines in the crossbar array 300 via the symbolized connections 412.

FIG. 5 is a diagram 500 of a first experimental evidence of the proposed system and method. The X-axis shows the time during which the resistance (Y-axis, left side) changes over time. On the right-side Y-axis the voltage $V_{gate}$ is shown and the respective change in the resistance drift may be observed after about 100 seconds. The drift correction utilizing the gate may decrease the drift coefficient by more than three orders of magnitude.

FIG. 6 shows diagrams 600 of second experimental evidence of the proposed system and method. The topmost diagram is a typical uncorrected resistance drift effect over time. The middle diagram shows the corrected resistance value showing only a drift coefficient of −0.006. The lowest partial diagram shows the standard deviation of about 0.02 of the drift coefficient.

Hence, the experiment of the results prove that thermal disturbance and resistance drift may be very effectively addressed by the here proposed method and the related system for a practical use of the memristor memory devices in industrial applications.

FIG. 7 is a flowchart of an embodiment of the method 700 for operating the memristor memory device comprising a memristive memory cell. The method 700 comprises providing, in operation 702, the memristor memory device comprises an input terminal, an output terminal, and a gate terminal, wherein the input terminal and the output terminal are directly attached to the memristive memory cell, and wherein the gate terminal is electrically isolated from the memristive memory cell.

The method 700 comprises also providing, in operation 704, an electrical signal for a volatile modulation of the conductance of the memristive memory cell, and thereby correcting, in operation 706, non-ideal conductance modulations—as discussed above—to the memristor memory device.

The descriptions of the various embodiments of the various embodiments have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

The various embodiments may be embodied as a system and a method. Aspects of the various embodiments are described herein with reference to flowchart illustrations and/or block diagrams of methods, and apparatus (systems). It will be understood that each block of the flowchart illustrations and/or block diagrams, and combinations of blocks in the flowchart illustrations and/or block diagrams, can be implemented by computer readable program instructions.

The flowcharts and/or block diagrams in the figures illustrate the architecture, functionality, and operation of possible implementations of systems, methods, and computer program products according to various embodiments of the various embodiments. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or act or carry out combinations of special purpose hardware and computer instructions.

The terminology used herein is for the purpose of describing particular embodiments only and is not intended to limit the invention. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the various embodiments has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

What is claimed is:

1. A memristor memory device comprising a memristive memory cell, the memristor memory device comprising:
   an input terminal;
   an output terminal; and
   a gate terminal;
   wherein:
   the input terminal and the output terminal are directly attached to the memristive memory cell;
   the gate terminal is electrically isolated from the memristive memory cell; and
   the gate terminal is configured for receiving an electrical signal for a volatile modulation of a conductance of the memristive memory cell to correct non-ideal conductance modulations of the memristor memory device.

2. The memristor memory device according to claim 1, wherein the non-ideal conductance modulations comprise at least one of a temporal resistance drift and a temperature-induced disturbance of the resistance.

3. The memristor memory device according to claim 1, wherein the memristive memory cell comprises a phase change material or a filamentary electrolyte.

4. The memristor memory device according to claim 1, wherein:
   the memristor memory device comprises a plurality of the memristive memory cells; and
   the gate terminal is common to the plurality of the memristive memory cells.

5. The memristor memory device according to claim 4, wherein the plurality of memristive memory devices is arranged in a crossbar array building a memristor memory unit.

6. The memristor memory device according to claim 1, further comprising:
   a temperature effect control unit which output is adapted to provide a temperature-effect control signal corresponding to a temperature difference $\Delta T$ between an ideal working temperature of the memristor memory device and a non-ideal dynamically changing temperature of the memristor memory device.

7. The memristor memory device according to claim 6, wherein the temperature-effect control unit further comprises:
   a temperature sensor electrically connected to the temperature-effect control unit; and
   a pre-calibrated $\Delta T$ to VT gate conversion unit that provides, as the temperature-effect control signal, a voltage of value VT to a group of gate terminals of selected ones of the plurality of the memristor memory devices.

8. The memristor memory device according to claim 7, wherein the pre-calibrated ΔT to VT gate conversion unit further comprises:
    a first digital-to-analogue converter adapted for converting a digital temperature-effect control signal to the analogue value VT gate signal connected to the gate terminals of the plurality of the memristor memory devices building a memristor memory unit.

9. The memristor memory device according to claim 1, further comprising:
    a resistance drift correction unit which output is adapted to provide a resistance-drift control signal corresponding to a resistance difference ΔR between a target resistance of the memristor memory device and a read resistance of the memristor memory device.

10. The memristor memory device according to claim 9, wherein the resistance drift correction unit further comprises:
    a ΔR to VR gate conversion unit providing, as the resistance drift correction control signal, a voltage of value VR to a group of gate terminals of selected ones of the plurality of the memristor memory devices.

11. The memristor memory device according to claim 10, wherein the ΔR to VR gate conversion unit further comprises:
    a second digital-to-analogue converter adapted for converting a digital resistance-effect control signal to the analogue value VR gate signal connected to the gate terminals of the plurality of the memristor memory devices building a memristor memory unit.

12. The memristor memory unit according to claim 1, comprising a plurality of memristor memory devices arranged in a crossbar array, wherein each of the memristor memory devices comprises:
    a memristive memory cell;
    an input terminal;
    an output terminal; and
    a gate terminal;
wherein:
    the input terminal and the output terminal are directly attached to the memristive memory cell;
    the gate terminal is electrically isolated from the memristive memory cell;
    the gate terminal is configured for receiving electrical signals for a volatile modulation of a conductance of the memristive memory cell to correct non-ideal conductance modulations of the memristor memory device;
the memristor memory unit further comprising:
    a temperature effect control unit adapted for generating a portion of the received electrical signals based on a temperature-based resistance drift effect of each of the memristor memory devices; and
    a resistance drift correction unit adapted for generating another portion of the received electrical signals based on a time-dependent resistance drift effect of each of the memristor memory devices.

13. A method for operating a memristor memory device comprising a memristive memory cell, the memristor memory device comprising:
    an input terminal, an output terminal, and a gate terminal, wherein the input terminal and the output terminal are directly attached to the memristive memory cell, and the gate terminal is electrically isolated from the memristive memory cell;
the method comprising:
    providing an electrical signal for a volatile modulation of a conductance of the memristive memory cell to correct non-ideal conductance modulations of the memristor memory device.

14. The method of claim 13, further comprising:
    providing, by a temperature effect control unit, a temperature-effect control signal corresponding to a temperature difference ΔT between an ideal working temperature of the memristor memory device and a non-ideal dynamically changing temperature of the memristor memory device.

15. The method of claim 14, wherein the temperature-effect control unit further comprises a temperature sensor electrically connected to the temperature effect control unit, the method further comprising:
    providing, by a pre-calibrated ΔT to VT gate conversion unit, as the temperature-effect control signal, a voltage of value VT, gate to the gate terminal.

16. The method of claim 15, wherein the also method further comprises:
    converting, by a first digital-to-analogue converter that is a portion of the pre-calibrated ΔT to VT gate conversion unit, a digital temperature-effect control signal to the analogue value VT gate signal connected to the gate terminal.

17. The method of claim 13, further comprising:
    providing, by a resistance drift correction unit, a resistance-drift control signal corresponding to a resistance difference ΔR between a target resistance of the memristor memory device and a read resistance of the memristor memory device.

18. The method of claim 17 further comprising:
    providing, by a ΔR to VR gate conversion unit that is a portion of the resistance drift correction unit, as the resistance drift correction control signal, a voltage of value VR to the gate terminal.

19. The method of claim 18, wherein the ΔR to VR gate conversion unit further comprises converting, by a second digital-to-analogue converter, a digital resistance-effect control signal to the analogue value VR gate signal connected to the gate terminal.

20. The method of claim 13, wherein:
    a condition is present selected from the group consisting of: a) the memristive memory cell comprises a phase change material or a filamentary electrolyte, and b) the memristor memory device comprising a plurality of the memristive memory cells, and the gate terminal is common to the plurality of the memristive memory cells.

* * * * *